United States Patent
Roy et al.

(10) Patent No.: US 9,111,985 B1
(45) Date of Patent: Aug. 18, 2015

(54) SHALLOW BIPOLAR JUNCTION TRANSISTOR

(75) Inventors: Alok Nandini Roy, San Jose, CA (US); Gulzar Kathawala, Santa Clara, CA (US); Zubin Patel, San Jose, CA (US); Hidehiko Shiraiwa, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 941 days.

(21) Appl. No.: 11/652,785

(22) Filed: Jan. 11, 2007

(51) Int. Cl.
*H01L 29/66* (2006.01)
*H01L 29/73* (2006.01)
*H01L 29/08* (2006.01)

(52) U.S. Cl.
CPC ............ *H01L 29/73* (2013.01); *H01L 29/0804* (2013.01)

(58) Field of Classification Search
CPC ............................ H01L 29/73; H01L 29/0804
USPC .................................................. 257/565–593
See application file for complete search history.

(56) References Cited

U.S. PATENT DOCUMENTS

| | | | | |
|---|---|---|---|---|
| 5,024,957 A * | 6/1991 | Harame et al. | ................ | 438/367 |
| 5,218,228 A * | 6/1993 | Williams et al. | ............. | 257/593 |
| 5,515,319 A * | 5/1996 | Smayling et al. | ........ | 365/185.27 |
| 5,759,882 A * | 6/1998 | Kao et al. | ....................... | 438/202 |
| 6,744,105 B1 * | 6/2004 | Chen et al. | ..................... | 257/382 |
| 2002/0109208 A1 * | 8/2002 | Kalnitsky et al. | ............. | 257/592 |
| 2002/0132416 A1 * | 9/2002 | Gamo et al. | .................. | 438/216 |
| 2003/0190786 A1 * | 10/2003 | Ramsbey et al. | ............. | 438/258 |
| 2004/0007716 A1 * | 1/2004 | Trogolo et al. | ............... | 257/197 |
| 2004/0021206 A1 * | 2/2004 | Ahmed et al. | ................ | 257/654 |
| 2005/0158954 A1 * | 7/2005 | Takahashi | ...................... | 438/261 |
| 2006/0125045 A1 * | 6/2006 | Yilmaz | ......................... | 257/510 |
| 2008/0144366 A1 * | 6/2008 | Zheng | ........................... | 365/182 |

FOREIGN PATENT DOCUMENTS

KR 1020050108200 * 11/2005 ............. H01L 29/73

* cited by examiner

*Primary Examiner* — Laura Menz
*Assistant Examiner* — Candice Y Chan

(57) ABSTRACT

A shallow bipolar junction transistor comprising a high voltage n+ well implanted into a semiconductor substrate. The shallow bipolar junction transistor further comprises a bit line n+ implant (BNI) above the high voltage n+ well and an oxide nitride (ONO) layer above the high voltage n+ well. A portion of the ONO layer isolates the BNI from a shallow trench isolation (STI) region.

7 Claims, 4 Drawing Sheets

SHALLOW BIPOLAR JUNCTION TRANSISTOR

TECHNICAL FIELD

Various embodiments of the present invention relate to the field of memory devices.

BACKGROUND ART

In electronic devices, there are many types of memory devices that are utilized for a variety of purposes including, but not limited to, retaining and/or conveying information and/or data, voltage and current manipulation and amplification, and other such purposes. One such memory device is a transistor, for example, a bipolar junction transistor (BJT). A BJT is versatile device and can be implemented in a variety of ways including, but not limited to, an amplifier, a switch, an oscillator, a reference voltage generator, a current controller, and in many other implementations. A typical BJT is a multi layered semiconductor commonly constructed in a three layer configuration, referred to as a PNP or NPN type transistor.

One type of BJT is an NPN type BJT, in which the letters "N" and "P" refer to the majority charge carriers inside the different regions of the transistor. NPN transistors typically consist of a layer of P-doped semiconductor material between two N-doped layers. NPN transistors are commonly operated with the emitter at ground and the collector connected to a positive voltage through an electric lead. A small current entering the base in common-emitter mode is amplified in the collector output.

The bipolar junction transistor (BJT) that has often been used in the reference voltage ($V_{ref}$) circuit, since the 180 nm node, consists of a high voltage p-well (HVPW) sandwiched between two n regions, hence an NPN type BJT. The bottom n region surrounds the p-region (HVPW) and serves as the collector. It is separated laterally from the top n-region, serving as the emitter, through trench isolation or shallow trench isolation (STI). The bottom of the STI lands in the HVPW and ensures isolation between the emitter and collector. When the base current begins to flow the BJT action is initiated with the current passing vertically from the collector to the emitter. The output of the $V_{ref}$ circuit serves as the reference voltage in the flash die. Hence it is designed such as to produce a fixed reference voltage that is independent of temperature or slight variations in the processing environment.

By virtue of the desire for improved performance and size reduction, smaller sized transistors, e.g., a 90 nm BJT, were exhibiting high and scattered betas, e.g., leakage. While legacy sized transistors, e.g., a 130 nm BJT, showed relatively low scatter values, 90 nm BJTs exhibited scatter values substantially higher. This anomalous BJT behavior was affecting the $V_{ref}$ output on the 90 nm BJT. The $V_{ref}$ output was between 1.4-1.6V with ~0.1V within wafer variation and about 1V lot-to-lot variation. The expectation however, was ~1.35V with a <0.1V variation from lot to lot. It is anticipated that further transistor size reduction will exacerbate the above described leakage.

The high scatter value in current BJTs is due to its non-ideal behavior, characterized by high and scattered N-value or ideality factor. The higher collector current for a similar base current was not due to intrinsic vertical BJT action but due to presence of an external current path between the emitter and collector. This current path would manifest at the bottom of the STI between the HVPW-oxide interface/region. Ideally the STI would isolate the collector from the emitter but this isolation was being compromised with the presence of this leakage path between the collector and emitter. Extending the STI deeper into the substrate can compromise the structural integrity of the transmitter.

In terms of a representative circuit, leakage, as a parasitic depletion transistor, occurred between the collector and emitter in parallel to the BJT. The leakage through this parasitic transistor was degrading the BJT and which in turn was compromising the functionality of the voltage reference ($V_{ref}$) circuit. The parasitic depletion transistor, in parallel to the BJT, is an unintentional by-product of the processing environment. This caused variable characteristics, from wafer to wafer and lot to lot, resulting in fluctuations in the $V_{ref}$ voltage, also from wafer to wafer and lot to lot.

SUMMARY OF THE INVENTION

Various embodiments of the present invention, a shallow bipolar junction transistor, are described herein. In one embodiment, a method for fabrication of a transistor device is provided. A high voltage n+ well is implanted into a semiconductor substrate. A core implant process for fabricating a core implant into the semiconductor substrate is performed, wherein the core implant process is performed at a periphery area of the semiconductor substrate.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF VARIOUS EMBODIMENTS

Figure 1:
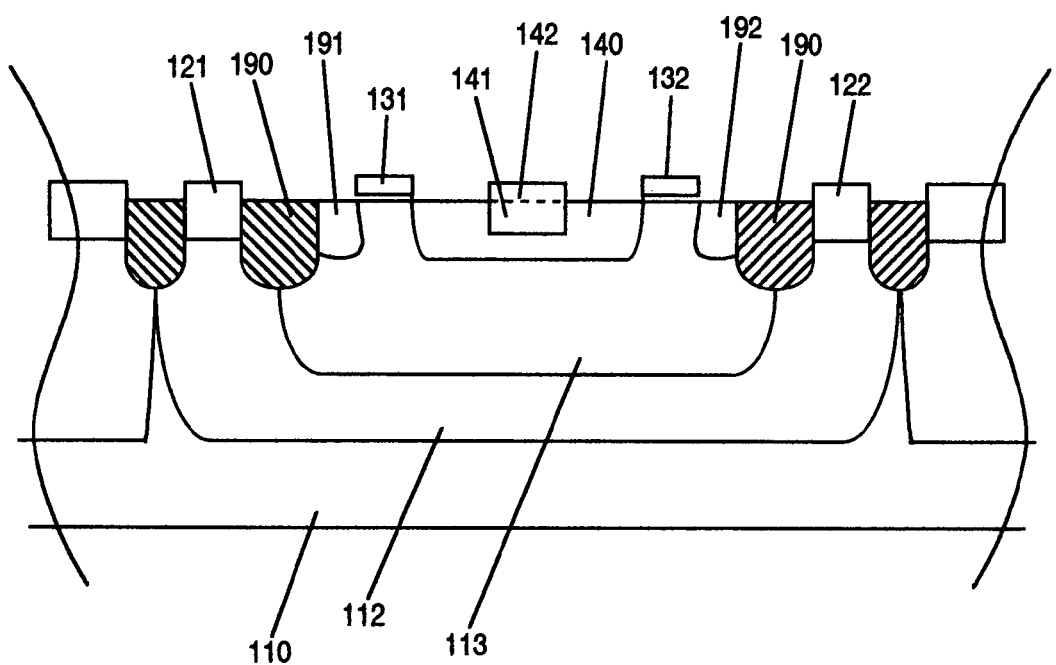
FIG. 1 is a cross section block diagram of a transistor in accordance with an embodiment of the present invention.

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "implanting," "performing," "forming," "etching," "filling" or the like, refer to actions and processes of a semiconductor fabrication process.

The discussion will begin with an overview of a transistor and elements disposed within. The discussion will then focus on embodiments of the invention that provide for a reduction in peripheral process steps through utilization of core processes in the fabrication of a transistor. The discussion will then focus on embodiments of this invention that allow for decreasing the real estate necessary to fabricate a transistor. Although embodiments of the present invention will be described in a transistor, it is understood that the embodiments described herein are useful outside of the art of transistors, such as devices requiring constant and dependable $V_{ref}$ and band gap references. Embodiments of the present invention provide for the utilization of transistor core fabrication processes for transistor periphery fabrication processes to reduce steps in transistor fabrication and to also reduce required transistor utilized real estate.

FIG. 1 is a cross section view of a transistor, e.g., a bipolar junction transistor (BJT) 100, in accordance with embodiments of the present invention. In the present embodiment, BJT 100 has dimensions of approximately 80 nanometers (nm) by 80 nm. It should be appreciated that embodiments of the present invention are well suited for implementation in transistors having dimensions that are smaller than BJT 100, e.g., transistors having dimensions equal to or smaller than 65 nm by 65 nm. BJT 100, in the present embodiment a NPN type transistor, shows a substrate 110. In an embodiment, substrate 110 is formed from silicon. In alternative embodiments, other materials or combinations of materials may be used in the formation of substrate 110.

BJT 100 also includes a high voltage deep N well (HVDNW) collector 112 and a high voltage P well (HVPW) base 113 that, in an embodiment of the present invention, is disposed above HVDNW 112, both of which are implanted in substrate 110. HVDNW 112 provides isolation of n+ collector gates 121 and 122 from base gates 131 and 132 of HPVW 113 in an embodiment of the present invention. In the present embodiment, well known implanting processes and steps are utilized in the fabrication of HVDNW 112 and HVPW 113. The implanting processes and steps can include, but which are not limited to, masking, etching, trenching, filling and the like.

Referring still to FIG. 1, BJT 100 further includes a p+ ring 191 and a p+ ring 192 for providing additional isolation of components and elements in transistor 100, in an embodiment of the present invention. Also shown are n+ collector electrode 121 and n+ collector electrode 122, both of which are gates of HVDNW 112. Further shown are base electrode 131 and base electrode 132, both of which are gates of HVPW 113. HVPW 113 provides isolation of n+ lightly doped drain (LDD) 140 from HVDNW 112, in an embodiment of the present invention. BJT 100 additionally includes an n+ emitter electrode 141 which, in an embodiment of the present invention, has disposed thereon a silicide island 142 for contact. BJT 100 is shown to have been subject to a shallow trench isolation (STI) process, and is isolated by STIs 190.

Figure 2:
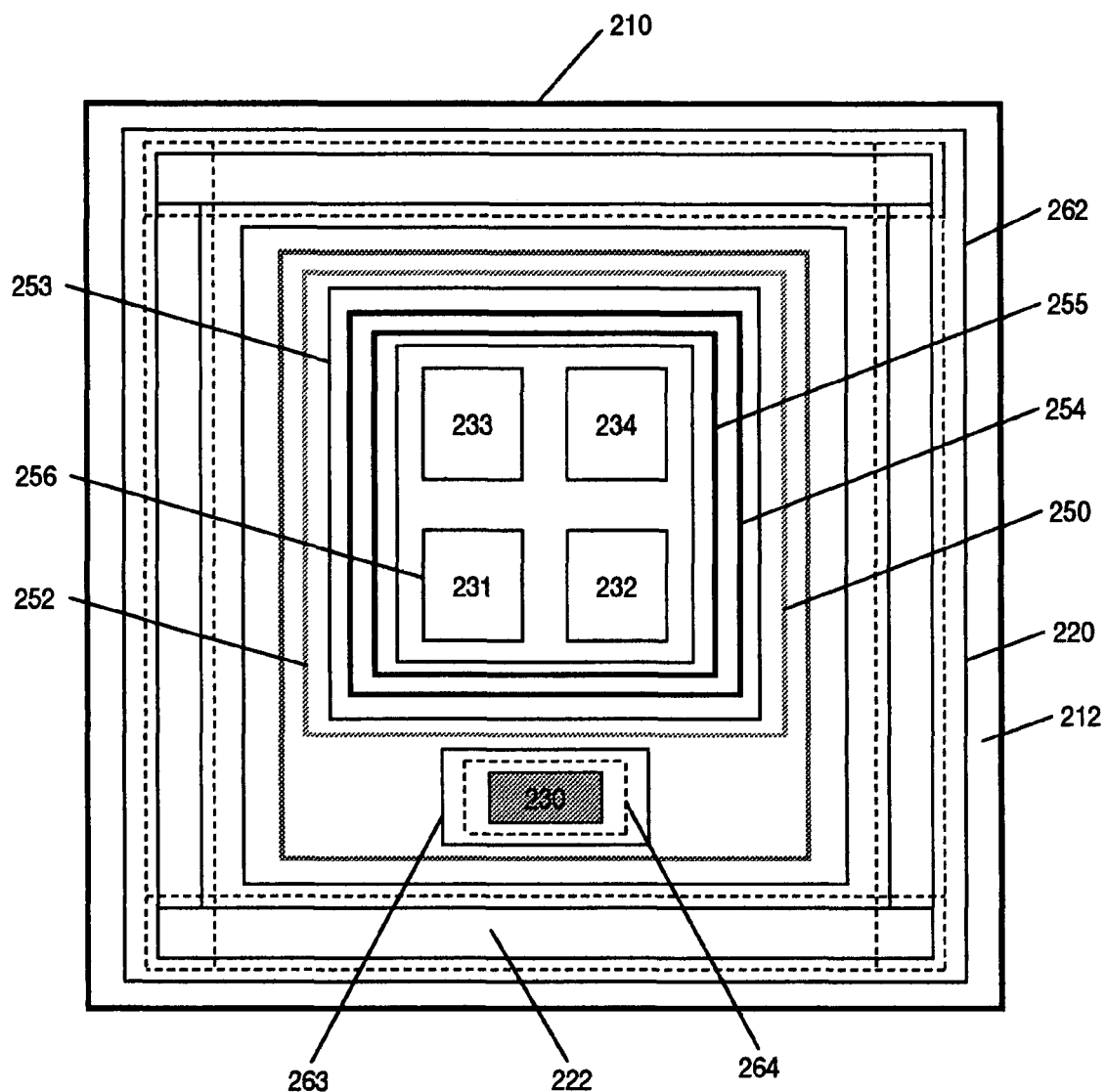
FIG. 2 is a plan view block diagram of a transistor in accordance with an embodiment of the present invention.

FIG. 2 is a plan view of a die 200 having a substrate 210 and in which a plurality of transistors 100 are fabricated, in an embodiment of the present invention. The various layers and elements of a transistor 100 fabricated from die 200 will be described from the outer edge inwardly. At the outermost area, wafer 200 shows a high voltage n+ well (HVNW) 212 having been implanted into substrate 210. Die 200 also includes an implanted n+ collector (NP) 220 disposed above HVNW 212. In an embodiment of the present invention, a high voltage gate oxide (HVGOX) 262 is formed above NP 220. A core implant process is performed on die 200 to fabricate a core implant (CI) 250 and is implanted into substrate 210. In an embodiment of the present, an STI process may be performed upon substrate 210 for isolating collector, base and emitter contacts (gates).

In an embodiment of the present invention, a typical previous fabrication technique that may have employed a cobalt silicide (CoSi) layer to open a contact to an emitter, e.g., emitter 231-234, is not required. It is noted that a CoSi layer can increase beta fluctuation when measuring performance of a transistor. Moreover, since the CoSi is not required, a silicide block layer is also not required. Accordingly, smaller dimension BJTs can be fabricated, saving space in a $V_{ref}$ circuit in the product die.

By eliminating the requirement of a CoSi process, embodiments of the present invention achieve a decrease in performance fluctuation (leakage) and further achieve a reduction in the number of process steps associated therewith.

In an embodiment of the present invention, and continuing in an inward direction, an oxide nitride oxide (ONO) layer 252 is formed on die 200. In an embodiment of the present invention, an ONO 252 replaces a typically implemented etch stop layer. Although an etch stopping layer has been implemented to prevent field leakage during transistor testing, its characteristics are not well suited for transistors whose dimensions are smaller than 80 nm×80 nm.

Still referring to FIG. 2, shown is a bit line residual oxide removal (BLROE)/spacer over etch (SPXOE) layer 253 formed on die 200, in an embodiment of the present invention. In the present embodiment, a BLROE/SPXOE layer 253, in conjunction with ONO layer 252, replaces an etch stopping layer process that is typically performed on die 200.

Figure 3:
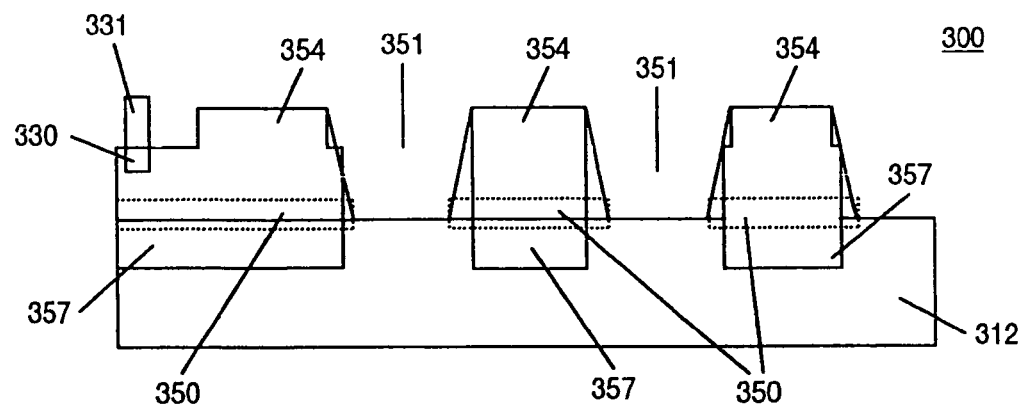
FIG. 3 is a cross section block diagram showing implants and a trench isolation structure in a transistor in accordance with an embodiment of the present invention.

Continuing, die 200 shows a bit line 255 etched and then filled with an oxide layer on die 200. Bit line 255 defines the location of a bit line n+ implant, e.g., BLI 254, in an embodiment of the present invention. In the present embodiment, a bit line implant (BLI) 254 provides an n+ implant in die 200. In an embodiment, a pocket implant (POI), not shown in FIG. 2 but shown as POI 357 in FIG. 3, is implanted in die 200. In an embodiment of the present invention, BLI 254 and a POI implant processes may be combined into a single process.

With reference still to FIG. 2, shown is an n+ core implant (NCI) 256, in an embodiment of the present invention. NCI 256 defines the difference between base 230 and an emitter, e.g., emitter 231-234, and to isolate base 230 and emitters 231-234. Also shown is a base 230 around which has been formed a HVGOX 263 and a P+S/D implant (PP) layer 264. Additionally shown are emitters 231, 232, 233 and 234, in an embodiment of the present invention. Also shown is a collector layer 222 that is formed in conjunction with a CI 250 process.

FIG. 3 is a cross section block diagram depicting the disposition of implant element and trench element processes performed in a process for fabrication of a transistor, e.g., transistor 300, in an embodiment of the present invention. Shown in transistor 300 is a high voltage n+ well (HVNW) 312. Also shown are a CI 350, a POI 357, and a BNI 354 in an embodiment of the present invention. Transistor 300 is shown to have been subject to a shallow trench isolation process, e.g., STI 351 in which each STI 351 is interposed between each BNI (bit line n+ implant) 354, in an embodiment of the present invention. In an embodiment, each STI 351 may be filled with one or more layers of poly. Also shown in transistor 300 is a base gate 331 to pick up the base 330. In an embodiment, base gate 331 may be comprised of p+, PP and HPLDD elements.

Figure 4:
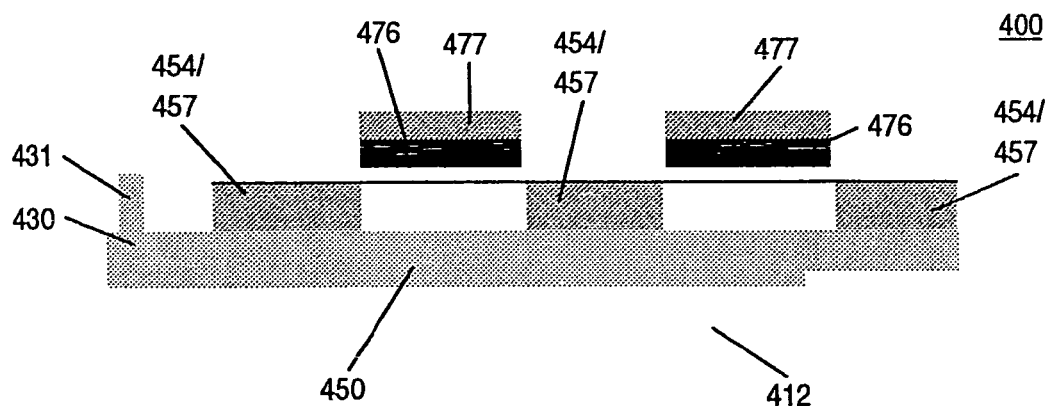
FIG. 4 is a cross section block diagram showing the disposition of the base and emitter gates of a transistor in accordance with an embodiment of the present invention.

FIG. 4 is a cross section block diagram showing the disposition of the base and emitter gates of a transistor, e.g., transistor 400, in accordance with an embodiment of the present invention. Transistor 400 includes an HVNW 412, a CI 450 and a plurality of combinational BNI/POI 454/457 layers. In the present embodiment, BNI 454 and POI 457 are implanted concurrent with each other. Also shown in transistor 400 is a base gate 431 to pick up the base 430. In an embodiment, base gate 431 may be comprised of p+, PP and HPLDD elements. Transistor 400 further includes a first poly layer 476 and a second poly layer 477. In an embodiment of the present invention, second poly layer 477 is disposed above first poly layer 476.

Figure 5:
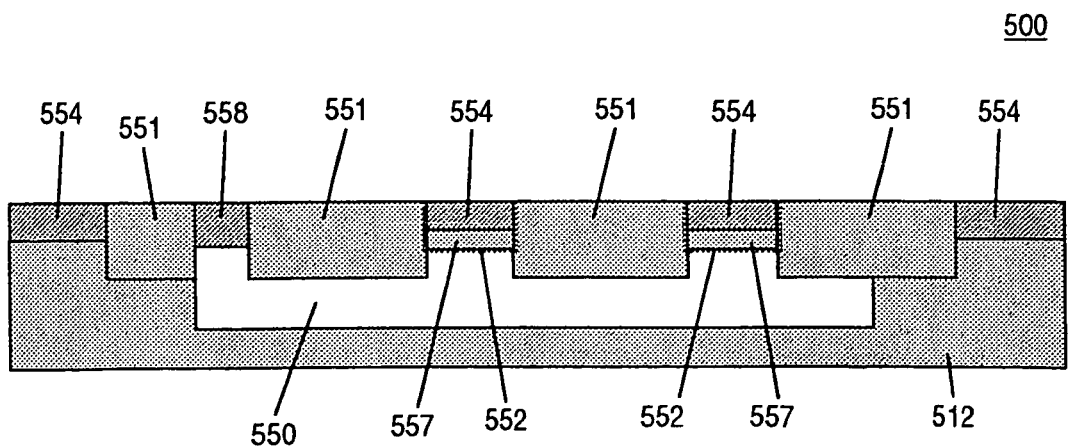
FIG. 5 is a cross section block diagram showing implants and trenching in a transistor in accordance with an embodiment of the present invention.

FIG. 5 is a cross section block diagram showing implants and trenching in a transistor, e.g., transistor 500, in accordance with an embodiment of the present invention. Transistor 500 includes a high voltage p+ well (HVPW) 512, a CI 550, a plurality of STIs 551 and a plurality of BNIs 554. Transistor 500 also includes a plurality of POIs 557 with a BNI 554 formed above each POI 557. In the present embodiment, transistor 500 further includes a POI 558 that is not disposed beneath a BNI 554.

Transistor 500 additionally includes an ONO 552 layer (indicated by dotted line 552) that is formed around each BNI 554 and disposed beneath each POI 557, so as to isolate a BNI 554 from an STI 551 proximally oriented thereto. It is noted that in the present embodiment, ONO 552 layer replaces an etch stop layer that is typically so disposed.

Figure 6:
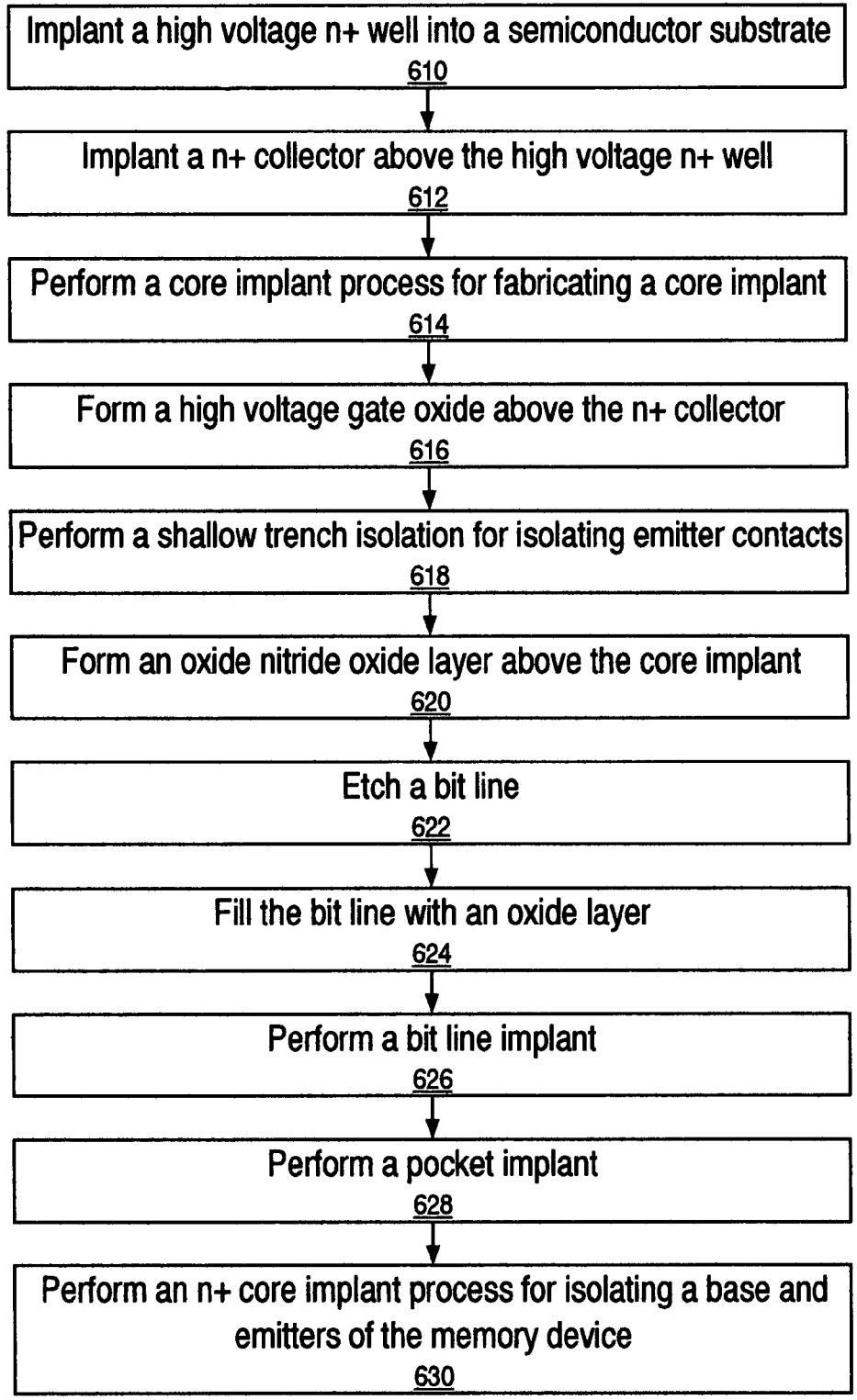
FIG. 6 is flowchart of a process for fabricating a transistor in accordance with an embodiment of the present invention.

FIG. 6 is a flowchart of a process 600 for fabricating a transistor in an embodiment of the present invention. FIG. 6 is a flow chart of a process 600 in which particular steps are performed in accordance with an embodiment of the present invention for fabricating a transistor. Although specific steps are disclosed in process 600, such steps are exemplary. That is, the present invention is well suited to performing various other steps or variations of the steps recited in FIG. 6. Within the present embodiment, it should be appreciated that the steps of process 600 may be performed by semiconductor fabrication system.

At step 610, a high voltage n+ well is implanted into a semiconductor substrate. In one embodiment, as shown at step 612, a n+ collector is implanted above said high voltage n+ well. At step 614, a core implant process is performed for fabricating a core implant into semiconductor substrate, in which the core implant process is performed at a periphery area of the semiconductor substrate. In one embodiment, as shown at step 616, a high voltage gate oxide is formed above the n+ collector. In one embodiment, as shown at step 618, a shallow trench isolation is performed for isolating emitter contacts.

In one embodiment, as shown at step 620, an oxide nitride oxide layer is formed above the core implant at a periphery area of the semiconductor substrate. In one embodiment, as shown at step 622, a bit line is etched and is filled with an oxide layer, as shown at step 624. In one embodiment, as shown at step 626 a bit line implant is performed at a periphery area of the semiconductor substrate. In one embodiment, as shown at step 628, a pocket implant is performed at a periphery area of the semiconductor substrate, wherein the bit line implant and said pocket implant are performed using one mask. In one embodiment, as shown at step 630, an n+ core implant process is performed for isolating a base and emitters of said memory device.

Embodiments of the present invention provide for the fabrication of a BJT without requiring a CoSi layer to open a contact to an emitter, since the emitter contact is a core contact. Removing the CoSi layer allows for reduced beta fluctuation and tighter beta values. Also, by eliminating the requirement of the CoSi process, embodiments of the present invention achieve a decrease in performance fluctuation (leakage) and further achieve a reduction in the number of process steps associated therewith. Moreover, since the CoSi is not required, a silicide block layer is also not required. Accordingly, smaller dimension BJTs can be fabricated, saving space in a $V_{ref}$ circuit in the product die. Embodiments of the present invention also provide for a wide alignment margin for the core implant, e.g., core contact, as it is narrow. Moreover, embodiments of the present invention do not require an etch stop layer, as the ONO layer may replace the etch stop layer.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A shallow bipolar junction transistor comprising:
a high voltage n+ well implanted into a semiconductor substrate;
an oxide nitride oxide (ONO) layer, an n+ collector, and a bit line residual oxide removal (BLROE)/spacer over etch (SPXOE) layer above said high voltage n+ well;
a bit line n+ implant (BNI) above said high voltage n+ well, wherein a portion of said ONO layer is formed around a portion of said BNI;
a plurality of emitters in a central region of the transistor, a base laterally separated from the plurality of emitters, and an n+ core implant surrounding the plurality of emitters to isolate the base and the plurality of emitters, wherein the n+ core implant defines a difference between said base and an emitter;
a high voltage gate oxide (HVGOX) above said n+ collector and around said base; and
a p+ source/drain implant (PP) layer around said base.

2. The shallow bipolar junction transistor of claim 1 wherein said oxide nitride oxide (ONO) layer is at a periphery area of said BNI.

3. The shallow bipolar junction transistor of claim 1 further comprising a shallow trench isolation (STI) region proximate to said ONO layer.

4. The shallow bipolar junction transistor of claim 1 wherein said bit line n+ implant is at a periphery area of said plurality of emitters.

5. The shallow bipolar junction transistor of claim 4 further comprising an n+ implant for isolating a base and emitters of said shallow bipolar junction transistor.

6. The shallow bipolar junction transistor of claim 1 further comprising an emitter wherein a portion of said emitter is operable to operate as a contact.

7. The shallow bipolar junction transistor of claim 6 wherein said portion of said emitter is operable to operate as a contact without a cobalt silicide (CoSi) layer.

\* \* \* \* \*